(12) United States Patent
Hiramatsu

(10) Patent No.: US 6,888,106 B2
(45) Date of Patent: May 3, 2005

(54) CERAMIC HEATER

(75) Inventor: Yasuji Hiramatsu, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/926,713

(22) PCT Filed: Apr. 9, 2001

(86) PCT No.: PCT/JP01/03025

§ 371 (c)(1),
(2), (4) Date: Mar. 5, 2002

(87) PCT Pub. No.: WO01/78456

PCT Pub. Date: Oct. 18, 2001

(65) Prior Publication Data

US 2003/0160041 A1 Aug. 28, 2003

(30) Foreign Application Priority Data

Apr. 7, 2000 (JP) ........................................ 2000-106813

(51) Int. Cl.[7] .............................................. H05B 3/68
(52) U.S. Cl. ................... 219/444.1; 219/543
(58) Field of Search ........................ 219/443.1, 444.1, 219/465.1, 466.1, 543, 544, 548; 338/307, 308; 118/724, 725

(56) References Cited

U.S. PATENT DOCUMENTS

| | | | | |
|---|---|---|---|---|
| 4,217,570 A | * | 8/1980 | Holmes ....................... | 338/308 |
| 4,449,039 A | * | 5/1984 | Fukazawa et al. .......... | 219/553 |
| 5,616,024 A | * | 4/1997 | Nobori et al. ............... | 432/241 |
| 5,851,298 A | * | 12/1998 | Ishii ............................ | 118/728 |
| 6,080,970 A | * | 6/2000 | Yoshida et al. ........... | 219/444.1 |
| 6,133,557 A | * | 10/2000 | Kawanabe et al. ......... | 219/544 |
| 6,150,636 A | * | 11/2000 | Bogdanski et al. ...... | 219/461.1 |
| 6,423,400 B1 | * | 7/2002 | Yushio et al. ................ | 428/210 |
| 6,465,763 B1 | | 10/2002 | Ito et al. | |
| 6,475,606 B2 | | 11/2002 | Niwa | |
| 6,507,006 B1 | | 1/2003 | Hiramatsu et al. | |
| 6,534,751 B2 | | 3/2003 | Uchiyama et al. | |
| 6,677,557 B2 | | 1/2004 | Ito et al. | |
| 6,710,307 B2 | | 3/2004 | Ito et al. | |
| 6,717,116 B1 | | 4/2004 | Ito et al. | |
| 2002/0043527 A1 | | 4/2002 | Ito | |
| 2003/0015521 A1 | | 1/2003 | Ito | |

FOREIGN PATENT DOCUMENTS

| | | |
|---|---|---|
| EP | 1 109 423 A1 | 6/2001 |
| JP | 63-118196 | 7/1988 |
| JP | 2-5392 | 1/1990 |
| JP | 10-223736 | 8/1998 |
| JP | 11-40330 | 2/1999 |
| JP | 2001-244057 | 9/2001 |

OTHER PUBLICATIONS

U.S. patent application Ser. No. 09/471,759, Saito et al., filed Dec. 23, 1999.
U.S. patent application Ser. No. 09/462,067, Furukawa et al., filed Jan. 5, 2001.
U.S. patent application Ser. No. 10/345,356, Ito, filed Jan. 16, 2003.
U.S. patent application Ser. No. 09/787,954, Ito, filed Mar. 23, 2001.
U.S. patent application Ser. No. 09/787,816, Ito, filed Mar. 23, 2001.

(Continued)

*Primary Examiner*—S. Paik
(74) *Attorney, Agent, or Firm*—Oblon, Spivak, McClelland, Maier & Neustadt, P.C.

(57) ABSTRACT

A ceramic heater making it possible to prevent a short circuit in its resistance heating element and heat a semiconductor wafer evenly. The ceramic beater includes a ceramic substrate, an insulating layer having volume resistivity higher than that of the ceramic substrate, being formed on at least a part of the ceramic substrate, and a resistance heating element formed on the insulating layer.

12 Claims, 8 Drawing Sheets

OTHER PUBLICATIONS

U.S. patent application Ser. No. 09/787,818, Ito, filed Mar. 23, 2001.
U.S. patent application Ser. No. 09/806,957, Ito et al., filed Apr. 6, 2001.
U.S. patent application Ser. No. 09/926,730, Hiramatsu et al., filed Apr. 16, 2001.
U.S. patent application Ser. No. 09/880,742, Saito et al., filed Jun. 13, 2001.
U.S. patent application Ser. No. 09/880,359, Saito et al., filed Jun. 13, 2001.
U.S. patent application Ser. No. 09/880,379, Saito et al., filed Jun. 13, 2001.
U.S. patent application Ser. No. 09/915,418, Ito, filed Jul. 27, 2001.
U.S. patent application Ser. No. 09/916,682, Ito, filed Jul. 30, 2001.
U.S. patent application Ser. No. 09/890,358, Ito, filed Jul. 30, 2001.
U.S. patent application Ser. No. 09/917,749, Ito, filed Jul. 31, 2001.
U.S. patent application Ser. No. 09/958,689, Furukawa et al., filed Oct. 10, 2001.
U.S. patent application Ser. No. 09/979,676, Zhou, filed Nov. 5, 2001.
U.S. patent application Ser. No. 10/048,894, Furukawa, Feb. 1, 2002.
U.S. patent application Ser. No. 10/049,539, Zhou, filed Nov. 7, 2001.
U.S. patent application Ser. No. 10/182,009, Zhou, filed Jul. 24, 2002.
U.S. patent application Ser. No. 10/222,928, Ito, filed Aug. 19, 2002.
U.S. patent application Ser. No. 10/265,413, Ohashi et al., filed Oct. 7, 2002.
U.S. patent application Ser. No. 10/356,519, Ito, filed Feb. 3, 2003.
U.S. patent application Ser. No. 10/217,029, Ito, filed Aug. 13, 2002.
U.S. patent application Ser. No. 09/831,887, Ito et al., filed May 23, 2001.
U.S. patent application Ser. No. 09/807,960, Hiramatsu et al., filed May 18, 2001.
U.S. patent application Ser. No. 09/869,321, Zhou, filed Oct. 18, 2001.
U.S. patent application Ser. No. 09/926,012, Hiramatsu et al., filed Oct. 24, 2001.
U.S. patent application Ser. No. 09/926,092, Ito et al., filed Dec. 27, 2001.
U.S. patent application Ser. No. 09/926,297, Hiramatsu et al., filed Dec. 26, 2001.
U.S. patent application Ser. No. 09/926,296, Ito et al., filed Dec. 27, 2001.
U.S. patent application Ser. No. 09/926,362, Hiramatsu et al., filed Jan. 16, 2002.
U.S. patent application Ser. No. 09/926,465, Furukawa et al., filed Feb. 12, 2002.
U.S. patent application Ser. No. 09/926,464, Hiramatsu et al., filed Jan. 10, 2002.
U.S. patent application Ser. No. 09/926,499, Hiramatsu et al., filed Mar. 26, 2002.
U.S. patent application Ser. No. 09/926,714, Ito et al., filed Mar. 5, 2001.
U.S. patent application Ser. No. 09/926,713, Hiramatsu, filed Mar. 5, 2002.
U.S. patent application Ser. No. 10/009,174, Hiramatsu et al., filed Apr. 21, 2003.
U.S. patent application Ser. No. 10/019,448, Ito et al., filed Apr. 8, 2002.
U.S. patent application Ser. No. 09/926,800, Hiramatsu et al., filed Mar. 19, 2002.
U.S. patent application Ser. No. 10/019,444, Hiramatsu et al., filed Apr. 23, 2002.
U.S. patent application Ser. No. 10/019,311, Hiramatsu et al., filed Apr. 9, 2002.
U.S. patent application Ser. No. 10/030,123, Hiramatsu et al., filed May 16, 2002.
U.S. patent application Ser. No. 10/049,293, Ito et al., filed Apr. 30, 2002.
U.S. patent application Ser. No. 10/069,943, Ito et al., filed Jul. 10, 2002.
U.S. patent application Ser. No. 10/048,490, Ito et al., filed Apr. 30, 2002.
U.S. patent application Ser. No. 10/048,979, Hiramatsua et al., filed Apr. 26, 2002.
U.S. patent application Ser. No. 10/048,989, Hiramatsu et al., filed May 29, 2002.
U.S. patent application Ser. No. 10/069,511, Ito et al., filed Jun. 24, 2002.
U.S. patent application Ser. No. 10/069,510, Hiramatsu et al., filed Jun. 20, 2002.
U.S. patent application Ser. No. 10/070,443, Hiramatsu et al., Jun. 24, 2002.
U.S. patent application Ser. No. 10/070,441, Ito et al., filed Jun. 26, 2002.
U.S. patent application Ser. No. 10/088,098, Ito et al., filed May 30, 2002.
U.S. patent application Ser. No. 10/088,100, Ido, filed Jun. 26, 2002.
U.S. patent application Ser. No. 10/111,980, Ito et al., filed Jun. 27, 2002.
U.S. patent application Ser. No. 10/168,527, Hiramatsu et al., filed Oct. 18, 2002.
U.S. patent application Ser. No. 10/181,724, Hiramatsu et al., filed Sep. 27, 2002.
U.S. patent application Ser. No. 10/226,160, Ito et al., filed Aug. 23, 2002.
U.S. patent application Ser. No. 10/229,177, Hiramatsu et al., filed Aug. 28, 2002.
U.S. patent application Ser. No. 10/277,818, Hiramatsu et al., filed Oct. 23, 2002.
U.S. patent application Ser. No. 10/311,368, Ito et al., filed May 9, 2003.
U.S. patent application Ser. No. 10/352,138, Hiramatsu et al., filed Jan. 28, 2003.
U.S. patent application Ser. No. 10/346,095, Ito et al., filed Jan. 17, 2003.
U.S. patent application Ser. No. 10/343,747, Ito et al., filed Aug. 27, 2003.
U.S. patent application Ser. No. 10/344,148, Kariya et al., filed Jul. 29, 2003.
U.S. patent application Ser. No. 10/343,833, Zhou et al., filed Sep. 22, 2003.
U.S. patent application Ser. No. 10/386,615, Hiramatsu et al., filed Mar. 13, 2003.
U.S. patent application Ser. No. 10/387,452, Ito et al., filed Mar. 14, 2003.

U.S. patent application Ser. No. 10/363,310, Ito, filed Mar. 3, 2003.

U.S. patent application Ser. No. 10/397,321, Hiramatsu et al., filed Mar. 27, 2003.

U.S. patent application Ser. No. 10/398,393, Hiramatsu et al., filed Jan. 21, 2004.

U.S. patent application Ser. No. 10/442,967, Hiramatsu et al., filed May 22, 2003.

U.S. patent application Ser. No. 10/260,360, Niwa, filed Oct. 1, 2002.

U.S. patent application Ser. No. 10/615,950, Hiramatsu et al., filed Jul. 10, 2003.

U.S. patent application Ser. No. 10/416,497, Hiramatsu et al., filed Dec. 11, 2003.

U.S. patent application Ser. No. 10/618,651, Ito et al., filed Jul. 15, 2003.

U.S. patent application Ser. No. 10/618,623, Ito et al., filed Jul. 15, 2003.

U.S. patent application Ser. No. 10/618,655, Ito et al., filed Jul 15, 2003.

U.S. patent application Ser. No. 10/618,665, Ito et al., filed Jul 15, 2003.

U.S. patent application Ser. No. 10/432,639, Ito et al., filed Nov. 6, 2003.

U.S. patent application Ser. No. 10/380,327, Hiramatsu et al., May 8, 2003.

U.S. patent application Ser. No. 10/619,567, Hiramatsu et al., filed Jul. 16, 2003.

U.S. patent application Ser. No. 10/362,941, Ito, filed Apr. 28, 2003.

U.S. patent application Ser. No. 10/624,589, Furukawa et al., filed Jul. 23, 2003.

U.S. patent application Ser. No. 10/244,008, Niwa, filed Sep. 16, 2002.

U.S. patent application Ser. No. 10/670,354, Niwa, Sep. 26, 2003.

U.S. patent application Ser. No. 10/658,454, Ito et al., filed Sep. 10, 2003.

U.S. patent application Ser. No. 10/663,681, Ito et al., filed Sep. 17, 2003.

U.S. patent application Ser. No. 10/473,585, Ito et al., filed Feb. 13, 2004.

U.S. patent application Ser. No. 10/697,287, Ito et al., filed Oct. 31, 2003.

U.S. patent application Ser. No. 10/718,535, Hiramatsu et al., filed Nov. 24, 2003.

U.S. patent application Ser. No. 09/673,953, Ito et al., filed Dec. 21, 2000.

U.S. patent application Ser. No. 09/926,713, Hiramatsu, filed Mar. 5, 2002.

U.S. patent application Ser. No. 10/732,296, Ito et al., Dec. 11, 2003.

U.S. patent application Ser. No. 10/746,081, Hiramatsu et al., filed Dec. 29, 2003.

U.S. patent application Ser. No. 10/755,308, Hiramatsu et al., filed Jan. 13, 2004.

U.S. patent application Ser. No. 10/766,027, Ito et al., filed Jan. 29, 2004.

U.S. patent application Ser. No. 10/759,083, Hiramatsu et al., filed Jan. 20, 2004.

U.S. patent application Ser. No. 09/926,713, Hiramatsu, filed Mar. 5, 2002.

* cited by examiner (a)

(b)

(c)

(d)

Warp=Y₁+Y₂ ered, developing the exposed resin and then subjecting the resultant to post-curing and sputtering, to form a conductor layer. For this purpose, it is necessary to heat the silicon wafer.

CERAMIC HEATER

FIELD OF THE INVENTION

The present invention relates to a ceramic heater which is used mainly in the semiconductor industry, particularly to a ceramic heater superior in insulation between circuits of resistance heating elements.

BACKGROUND ART

Semiconductors are very important goods necessary in various industries. A semiconductor chip, which is a typical product thereof, is produced, for example, by slicing a silicon monocrystal into a given thickness to produce a silicon wafer, and then forming various integrated circuits and the like on this silicon wafer.

In order to form integrated circuits and so on of this type, it is necessary to conduct a process of applying a photosensitive resin onto the silicon wafer, exposing the resin to light, developing the exposed resin and then subjecting the resultant to post-curing and sputtering, to form a conductor layer. For this purpose, it is necessary to heat the silicon wafer.

As this heater for heating the silicon wafer and the like, a ceramic heater is used. JP Kokai Hei 11-40330 and so on disclose heaters using a carbide ceramic or a nitride ceramic.

SUMMARY OF THE INVENTION

However, impurities, a sintering aid and so on are usually contained in a carbide ceramic. In many cases, the carbide ceramic has electric conductivity attributed to these substances. Therefore, even if resistance heating elements are disposed on the surface of such a conductive carbide ceramic, a short circuit is caused between circuits so that the temperature thereof cannot be controlled.

Therefore, if it is attempted to produce a carbide ceramic having no electric conductivity, it is essential to use an expensive high-purity carbide ceramic and chose an appropriate sintering aid. In many cases, electric conductive ceramics have high thermal conductivity at the same time. However, even if circuits are formed on such a ceramic, a short circuit is caused. Therefore, the ceramic cannot be used, as it is, as a ceramic substrate.

Furthermore, a ceramic comprising a nitride and the like which has insulation at ambient temperature has defects such as oxygen forming solid-solution. This causes a drop in volume resistivity at high temperature to result in a problem that a short circuit is caused between circuits, thus making temperature-control impossible. Thus, there is room for further improvement.

On the other hand, particularly when a semiconductor wafer is heated in the state that the semiconductor wafer and a ceramic substrate are separated from each other, a phenomenon that the temperature of the semiconductor wafer becomes uneven is observed even though the temperature of the surface of the ceramic substrate is made even. Solution of this problem together with the above-mentioned problem has been expected.

The inventors made eager investigations to solve the above-mentioned problems. As a result, it has been found out that by arranging, on one surface of a ceramic substrate, an insulating layer having a volume resistivity higher than that of the ceramic substrate and then forming a resistance heating element thereon, a short circuit in the resistance heating element can be prevented and further unevenness of the temperature of a semiconductor wafer can be overcome by the presence of this insulating layer. Thus, the inventors have accomplished the present invention.

That is, the ceramic heater of the first aspect of the present invention is a ceramic heater comprising: a ceramic substrate; an insulating layer having volume resistivity higher than that of the ceramic substrate, being formed on at least a part of the ceramic substrate; and a resistance heating element formed on the insulating layer.

Since the resistance heating element is formed on the insulating layer in the ceramic heater of the first aspect of the present invention, a short circuit is not caused in the resistance heating element even though the ceramic substrate itself has electric conductivity. Thus, the ceramic heater functions satisfactorily as a heater.

Even if the volume resistivity of the ceramic substrate drops at high temperature, the circuit of the resistance heating element can be prevented from being short-circuited since the volume resistivity of the insulating layer is higher than that of the ceramic substrate within the range of temperature at use.

In the present invention, it is unnecessary to use a particularly expensive ceramic. Even an electric conductive ceramic having a high thermal conductivity can be used as a heater.

In the ceramic heater of the first aspect of the present invention, it is desired that the ceramic substrate comprises a carbide ceramic or a nitride ceramic and the insulating layer comprises an oxide ceramic.

About a nitride ceramic, its volume resistivity drops easily at high temperature by formation of solid solution of oxygen therein. A carbide ceramic has an electric conductivity so far as the purity thereof is not made particularly high. A resistance heating element cannot be formed on the surface of a substrate comprising such a ceramic or inside the substrate to which no treatment is applied. Thus, by forming an insulating layer comprising an oxide ceramic on the surface of a ceramic substrate comprising such a material in the present invention, a short circuit between circuits can be prevented and the ceramic substrate can be caused to function as a heater.

It is desired that the opposite side to the face where the resistance heating element is formed of the ceramic substrate is a heating face.

Since the opposite side to the face where the resistance heating element is formed can be made to the heating face in the present invention, heat is conducted from the face where the resistance heating element is formed to the heating face while the heat is diffused. Thus, a temperature distribution similar to a pattern of the resistance heating element is not easily generated in the heating face.

The thickness of the insulating layer is desirably from 0.1 to 1000 $\mu$m.

If the thickness of the insulating layer is less than 0.1 $\mu$m, insulation property cannot be ensured. On the other hand, if the thickness of the insulating layer is over 1000 $\mu$m, the conduction of heat from the resistance heating element to the ceramic substrate is inhibited.

The volume resistivity of the insulating layer is desirably 10 times or more as large as that of the ceramic substrate(at the same measurement temperature).

If it is less than 10 times, a short circuit in the circuit of the resistance heating element cannot be prevented. The volume resistivity of the insulating layer is desirably from $10^6$ to $10^{18}$ $\Omega$·cm at 25° C. If the volume resistivity is less than $10^6$ $\Omega$·cm at 25° C., the insulating layer does not exhibit its original function when the temperature thereof rises. The ceramic layer having a volume resistivity over $10^{18}$ Ω·cm is poor in thermal conductivity.

For example, at 400° C., the volume resistivity of aluminum nitride is $10^9$ Ω·cm. At the same temperature, the volume resistivity of alumina is $10^{10}$ Ω·cm. At 25° C., the volume resistivity of silicon carbide is $10^3$ Ω·cm, and at the same temperature, the volume resistivity of silica is $10^{14}$ Ω·cm.

The ceramic heater of the second aspect of the present invention is a ceramic heater comprising a ceramic substrate and a resistance heating element formed on a surface of the ceramic substrate, wherein the ceramic substrate is warped in one direction.

The wording "is warped in one direction" includes not only the case that the ceramic substrate is warped in one direction without being undulated so as to form a curved face, but also the case that the ceramic substrate is warped in one direction with being undulated within the extent that the effect of the present invention is not impaired. The amount of the undulation is desirably 50% or less of the amount of the warp. The warp or the undulation is measured by means of a shape-measuring device (made by Keyence Corporation).

FIG. 7 is a graph schematically showing a relationship between the position in the horizontal direction and the position in the vertical direction on a surface of a ceramic substrate warped in one direction with being undulated. Its X axis represents the position in the horizontal direction, and its Y axis represents the position in the vertical direction. As shown in FIG. 7, an imaginary plan face is calculated based on the curve of measured data, and a difference between the maximum value $Y_1$ based on this imaginary plan face and the minimum value $Y_2$ based on this imaginary plan face: $(Y_1+Y_2)$ is defined as the warp amount. The maximum point $YW_1$ and the minimum value $YW_2$ of data obtained by subtracting the warp component from the measured data are the undulation (reference to FIG. 8). The range for the measurement is: a range of the length between the outer circumferential ends of the ceramic substrate (the diameter in case of a disc)—10 mm. Within this range, the warp amount is preferably from 10 to 100 μm.

In the ceramic heater of the second aspect of the present invention, the ceramic substrate can be warped in one direction by forming the insulating layer on one face thereof and the like. According to this, in case that a semiconductor wafer is heated in the state that the wafer is separated from the ceramic substrate by a given distance, the distance between the semiconductor wafer and the ceramic substrate can easily be grasped. By performing temperature-control dependently upon the distance, the surface temperature of the semiconductor wafer can be made even.

The ceramic substrate has undulation. In case that a semiconductor wafer is heated in the state that the wafer is separated from the ceramic substrate by a given distance, the distance between the semiconductor wafer and the ceramic substrate varies dependently on location owing to the undulation. Thus, the temperature of the semiconductor wafer becomes uneven.

In the present invention, however, irregular undulation can be removed by warping the ceramic substrate in one direction. Therefore, temperature-control becomes easy so that the surface temperature of the semiconductor wafer can be made even.

In the ceramic heater of the second aspect of the present invention, the warp amount of the ceramic substrate is desirably from 10 to 100 μm.

If the warp amount is less than 10 μm, the undulation cannot be overcome. On the other hand, if the warp amount is over 100 μm, it becomes difficult to make the temperature of the semiconductor wafer even. This warp is desirably formed to be convex at the side of the heating face (the face on which no resistance heating element is formed). In this case, the distance between the semiconductor wafer and the ceramic substrate becomes larger at a position nearer to the peripheral portion of the semiconductor wafer. Originally, the temperature of the peripheral portion inclined to drop. Thus, the calorific value of the resistance heating element is set to be large. Therefore, an existing control algorithm can be applied as it is, to make the temperature thereof even.

| Explanation of symbols | |
|---|---|
| 10, 20, 30 | ceramic heater |
| 11, 21, 31 | ceramic substrate |
| 11a, 21a, 31a | heating face |
| 11b, 21b, 31b | bottom face |
| 12, 22 | resistance heating element |
| 120, 220 | covering layer |
| 13, 23 | external terminal |
| 14 | bottomed hole |
| 15 | through hole |
| 16 | lifter pin |
| 17 | solder layer |
| 18, 28, 38 | insulating layer |
| 19 | silicon wafer |
| 32 | supporting pin |

DETAILED DISCLOSURE OF THE INVENTION

The ceramic heater of the first aspect of the present invention is a ceramic heater comprising: a ceramic substrate; an insulating layer having volume resistivity higher than that of the ceramic substrate, being formed on at least a part of the ceramic substrate; and a resistance heating element formed on the insulating layer.

Figure 1:
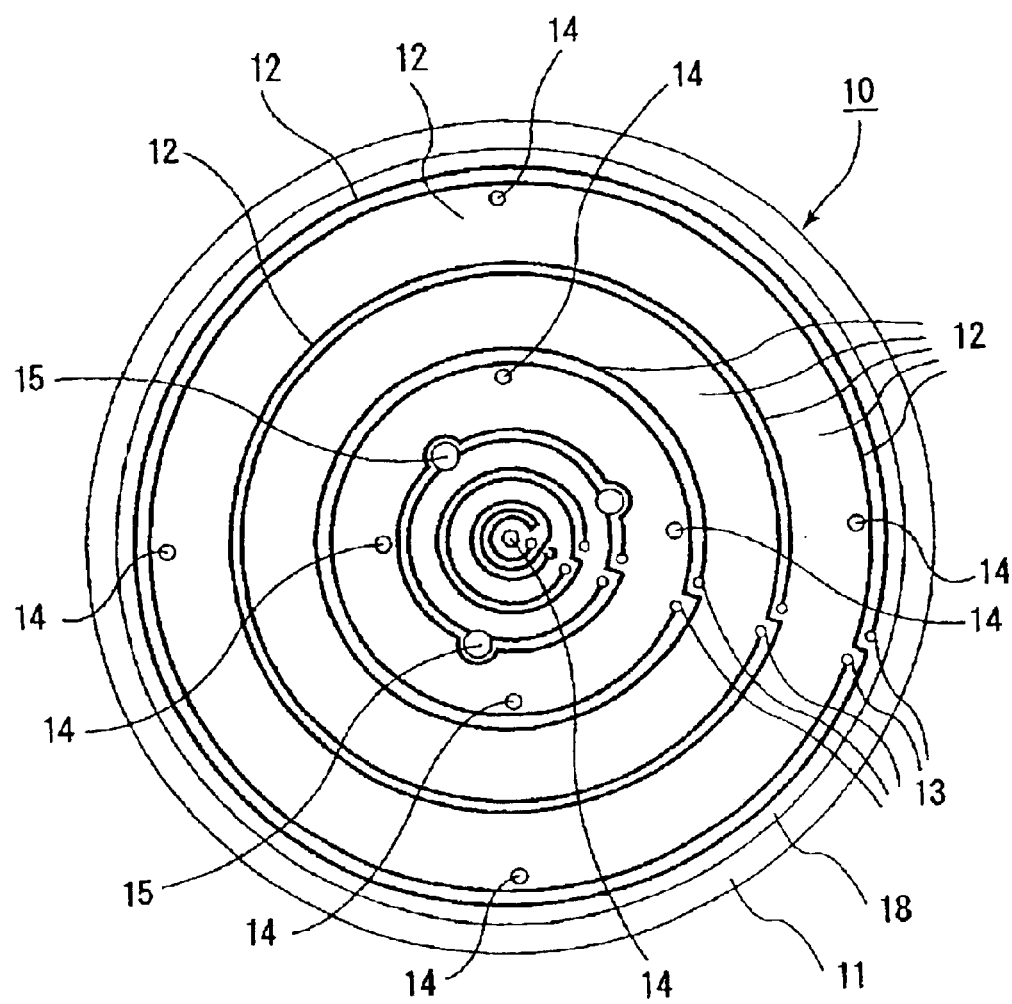
FIG. 1 is a bottom face view that schematically illustrates one example of the ceramic heater of the present invention.
Figure 2:
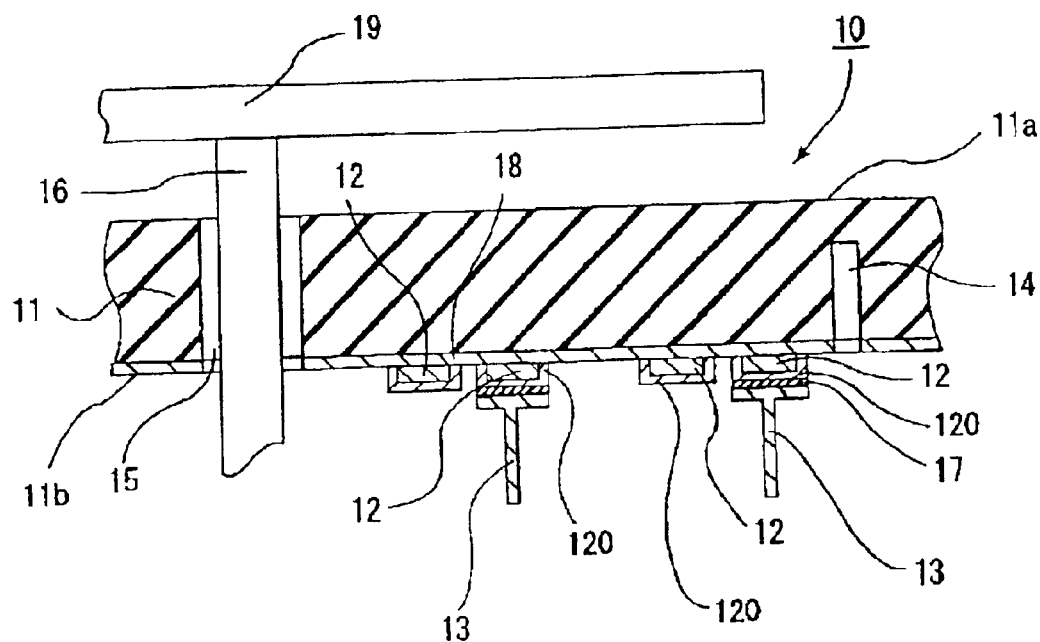
FIG. 2 is a partially enlarged sectional view of the ceramic heater illustrated in FIG. 1.

FIG. 1 is a bottom face view that schematically illustrates one embodiment of the ceramic heater of the first aspect of the present invention. FIG. 2 is a partially enlarged sectional view of the ceramic heater illustrated in FIG. 1.

As illustrated in FIGS. 1 and 2, a ceramic substrate 11 is made in a disk form. An insulating layer 18 is formed on a bottom face 11b of this ceramic substrate 11. On the surface of this insulating layer 18, resistance heating elements 12 composed of plural circuits are formed in a pattern of concentric circles-like. About these resistance heating elements 12, two of the concentric circles near to each other are connected to produce one line as a circuit.

A covering layer 120 for preventing oxidization of the resistance heating elements 12 and for other purposes is formed on the surface of the resistance heating elements 12. The resistance heating elements 12 on which this covering layer 120 is formed are connected to external terminals 13 through a solder layer 17.

Bottomed holes 14 are made in the bottom face 11b of the ceramic substrate 11 having the insulating layer 18, and temperature-measuring elements (not illustrated) comprising thermocouples and the like are inserted into the bottomed holes 14. The holes will be sealed with a heat resistant adhesive agent.

In the ceramic substrate 11, through holes 15 are made. As illustrated in FIG. 2, by inserting lifter pins 16 into the through holes 15, a silicon wafer 19 can be held. By moving the lifter pins 16 up and down, it is possible to: receive the silicon wafer 19 from a carrier machine; put the silicon wafer 19 on the heating face 11a of the ceramic substrate 11 and heat the wafer, or support the silicon water 19 in the state that it is 50 to 2000 μm apart from the heating face 11a and heat the wafer.

Figure 5:
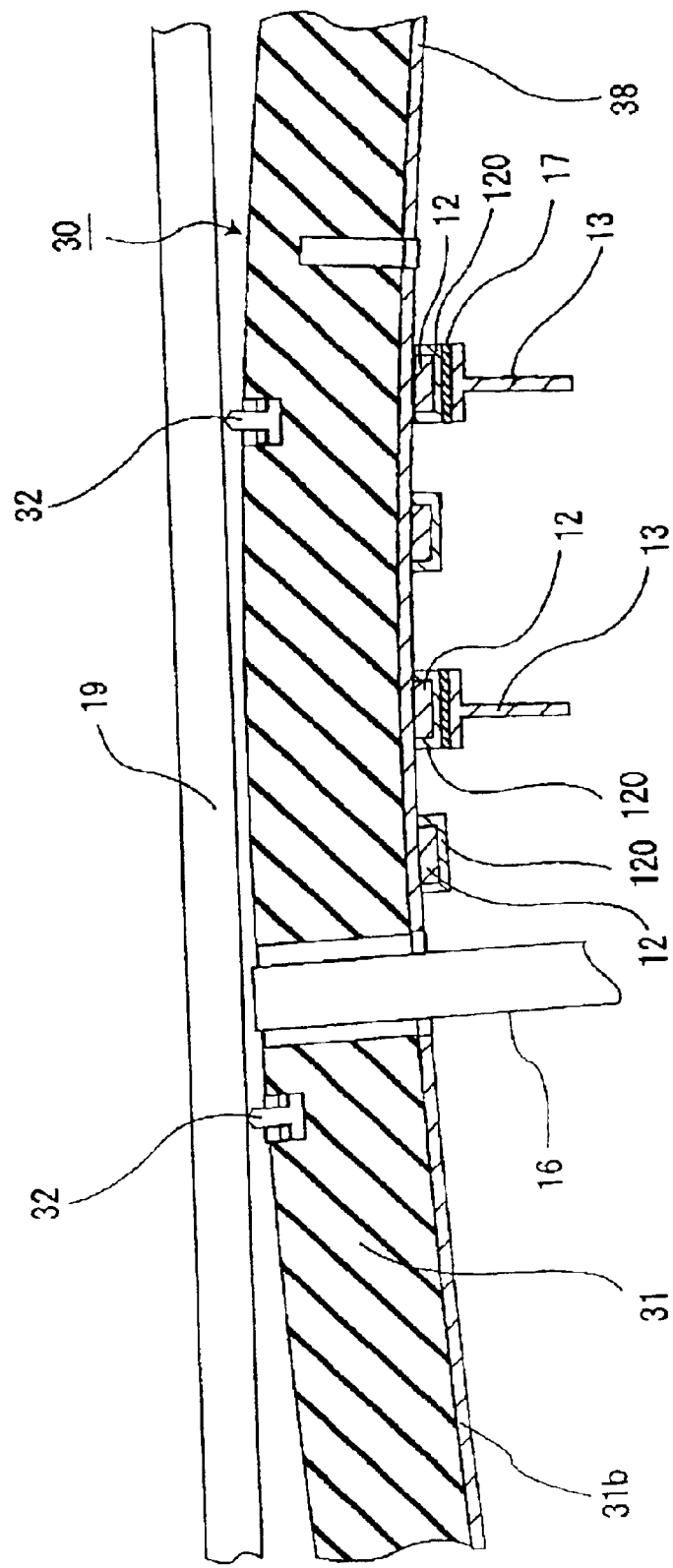
FIG. 5 is a sectional view that schematically illustrates a further example of the ceramic heater of the present invention.

It is allowable to make through holes or concave portions in the ceramic substrate; insert supporting pins whose tips are in an aspire form or semicircular form into the through holes or the concave portions; fix the supporting pins in the state that the pins are slightly projected from the ceramic substrate; and support the silicon wafer by the supporting pins, thereby supporting and heating the silicon wafer in the state that the silicon wafer is 50 to 2000 μm apart from the heating face (reference to FIG. 5).

It is desired that in the ceramic heater of the first aspect of the present invention the resistance heating elements 12 are divided into two or more circuits, as illustrated in FIG. 1. By the circuit-division, electric powers applied to the respective circuits can be changed so that the temperature of the heating face 11a can be adjusted.

By forming the insulating layer on the bottom face of the ceramic substrate; and disposing the resistance heating element on this insulating layer in this way in the first aspect of the present invention, the ceramic substrate can be caused to function as a heater even in case that: the ceramic substrate itself has a large electric conductivity at room temperature; or the resistance thereof drops at the range of high temperature.

Figure 3:
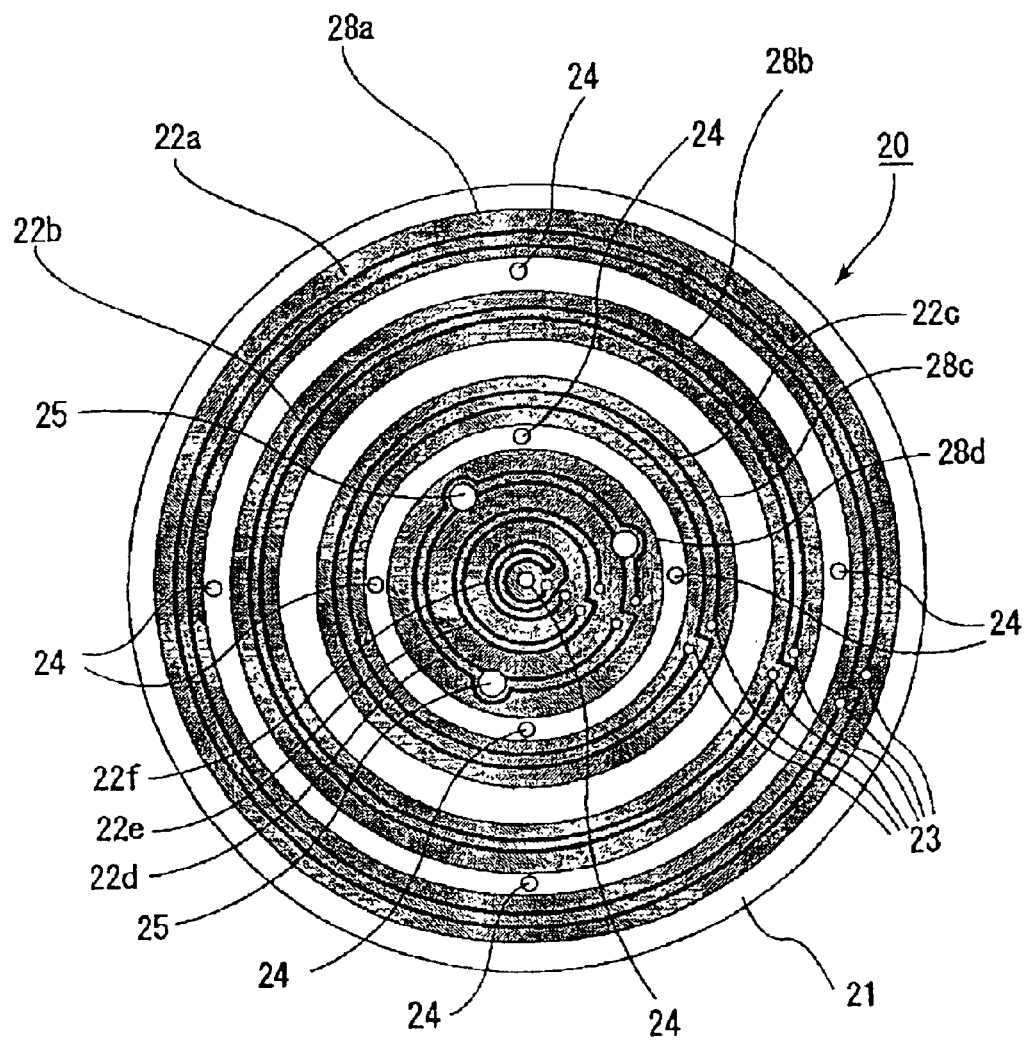
FIG. 3 is a bottom face view that schematically illustrates another example of the ceramic heater of the present invention.
Figure 4:
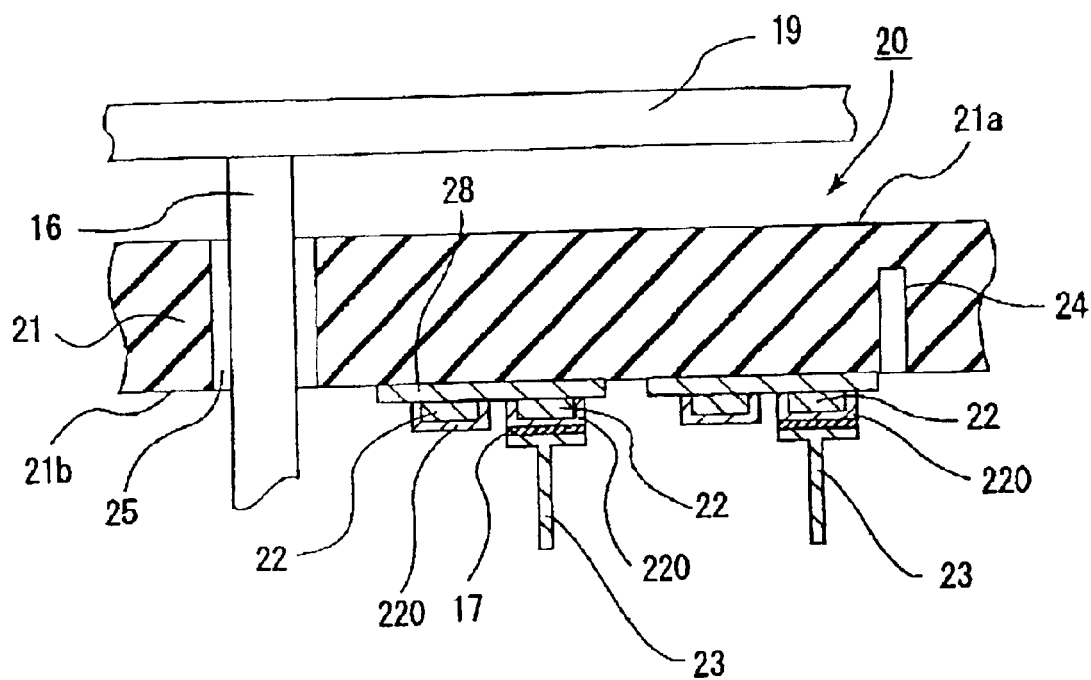
FIG. 4 is a partially enlarged sectional view of the ceramic heater illustrated in FIG. 3.

FIG. 3 is a bottom face view that schematically illustrates another embodiment of the ceramic heater of the first aspect of the present invention. FIG. 4 is a partially enlarged sectional view of the ceramic heater illustrated in FIG. 3.

In this ceramic heater 20, insulating layers 28a to 28c in a circular ring form and a circular insulating layer 28d are deposited on a bottom face 21b of a ceramic substrate 21. Resistance heating elements 22a to 22f are formed on the insulating layers 28a to 28d. External terminals 23 are connected to end portions thereof.

This ceramic heater has the same structure as the structure of the ceramic heater illustrated in FIGS. 1 and 2 except that the insulating layers 28a to 28d are deposited on parts of the bottom face 21b of the ceramic substrate 21 as described above.

In the ceramic heater illustrated in FIGS. 3 and 4, a short circuit between the circuits of the resistance heating elements can be prevented as well. The heater can be caused to function satisfactorily as a ceramic heater.

The following will describe the ceramic substrate constituting the ceramic heater of the first aspect of the present invention in more detail.

Examples of the nitride ceramic constituting the above-mentioned ceramic substrate include metal nitride ceramics such as aluminum nitride, silicon nitride, boron nitride and the like.

Examples of the above-mentioned carbide ceramic include metal carbide ceramics such as silicon carbide, zirconium carbide, tantalum carbide, tungsten carbide and the like.

In the present invention, it is desired that the ceramic substrate contains a sintering aid. Examples of the sintering aid that can be used include alkali metal oxides, alkali earth metal oxides, rare element oxides and the like.

Among these sintering aids, for example, CaO, $Y_2O_3$, $Na_2O$, $Li_2O$ and $Rb_2O$ are preferred. The content of these sintering aids is preferably from 0.1 to 20% by weight.

In case that the ceramic substrate comprises silicon carbide, examples of the sintering aid include B, C, AlN and the like.

Examples of the oxide ceramic which is used as the insulating layer in the present invention include silica, alumina, mullite, cordierite, beryllia and the like.

These ceramics may be used alone or in combination of two or more thereof.

The use of the oxide ceramic is favorable since the resistance heating elements can easily be adhered and fixed thereto.

Examples of the process for forming the insulating layer from these materials include, for example, a process of using a sol solution wherein an alkoxide is hydrolyzed, to form a covering layer on the surface of the ceramic substrate by spin-coating, and then drying and firing the layer; a sputtering method; a CVD method; and the like. Examples of the process for forming the insulating layer on parts of the surface of the ceramic substrate may be screen printing and the like. Glass powder paste may be applied thereto and fired at 500 to 1000° C.

In the present invention, the ceramic substrate preferably contains from 5 to 5000 ppm of carbon.

The ceramic substrate can be blackened by incorporating carbon. Thus, when the substrate is used as a heater, radiation heat can be sufficiently used.

Carbon may be amorphous or crystalline. When amorphous carbon is used, a drop in the volume resistivity at high temperature can be prevented. When crystalline carbon is used, a drop in the thermal conductivity at high temperature can be prevented. Therefore, both of crystalline carbon and amorphous carbon may be used dependently on use. The carbon content is more preferably from 50 to 2000 ppm.

When carbon is incorporated into the ceramic substrate, carbon is preferably incorporated in the manner that its brightness will be N6 or less as a value based on the rule of JIS Z 8721. The ceramic substrate having such a brightness is superior in radiant heat quantity and concealing property.

The brightness N is defined as follows: the brightness of ideal black is made to 0; that of ideal white is made to 10; respective colors are divided into 10 parts in the manner that the brightness of the respective colors is recognized stepwise between the brightness of black and that of white at equal intervals; and the resultant parts are indicated by symbols N0 to N10, respectively.

Actual brightness is measured by comparison with color charts corresponding to N0 to N10. One place of decimals in this case is made to 0 or 5.

The thickness of the ceramic substrate of the present invention is desirably 10 mm or less, particularly desirably 5 mm or less.

If the thickness of the ceramic substrate is over 10 mm, the heat capacity of the ceramic substrate becomes large so that the temperature-following property of the ceramic substrate deteriorates. The thickness of the ceramic substrate is desirably a value over 1.5 mm.

The diameter of the ceramic substrate is more desirably 200 mm or more, more desirably 12 inches (300 mm) or more. This is because silicon wafers having a large diameter, for example, a diameter of 12 inches or more will become the main stream of the next-generation semiconductor wafers.

The ceramic heater of the present invention is used desirably at 100° C. or higher, most preferably at 200° C. or higher.

The resistance heating elements desirably comprises a metal such as a noble metal (gold, silver, platinum or palladium), lead, tungsten, molybdenum, nickel and the like, or a conductive ceramic such as a carbide of tungsten or molybdenum and the like. Such a material makes it possible to make the resistance value high, and make its thickness itself large in order to prevent disconnection and the like. Additionally, such a material is not easily oxidized so that the thermal conductivity thereof does not drop easily. These may be used alone or in combination of two or more.

Since it is necessary to make the temperature of the whole of the ceramic substrate even, the resistance heating elements are preferably formed to have a pattern of concentric circles-like as illustrated in FIG. 1, or to have a pattern of concentric circles-like combined with a pattern of bending lines. The thickness of the resistance heating elements is desirably from 1 to 50 μm, and the width thereof is preferably from 5 to 20 mm.

The resistance value of the resistance heating elements can be changed dependently on their width or thickness. The above-mentioned ranges are however most practical. The resistance value of the resistance heating elements becomes larger as the resistance heating elements become thinner and narrower.

The section of the resistance heating elements may be in a rectangular, elliptic, spindle-like shape or semicircular form, and the resistance heating elements are desirably flat. In the flat resistance heating elements, heat is easily radiated toward the heating face so that the quantity of heat conducted to the heating face can be made large. Thus, a temperature distribution in the heating face is not easily generated. The resistance heating elements may be in a spiral form In order to form the resistance heating elements on the above-mentioned insulating layer, a conductor containing paste containing a metal or a conductive ceramic is preferably used.

That is, in case that the resistance heating elements are formed on the insulating layer formed on the ceramic substrate, the resistance heating elements are usually formed by the process comprising steps of performing firing to produce the ceramic substrate, forming the insulating layer on the bottom face thereof, forming a layer of the above-mentioned conductor containing paste on the surface thereof, and firing the layer.

The above-mentioned conductor containing paste is not particularly limited, and is preferably a paste comprising not only metal particles or conductive ceramic particles for keeping electrical conductivity hut also a resin, a solvent, a thickener and so on.

Examples of the raw material of the above-mentioned metal particles or conductive ceramic particles include the above-mentioned substances. The particle diameter of these metal particles or the conductive ceramic particles is preferably from 0.1 to 100 μm. If the particle diameter is too fine, that is, below 0.1 μm, they are easily oxidized. On the other hand, if the particle diameter is over 100 μm, they are not easily sintered so that the resistance value becomes large.

The shape of the above-mentioned metal particles may be spherical or scaly. When these metal particles are used, they may be a mixture of spherical particles and scaly particles.

In case that the metal particles are scaly or a mixture of spherical particles and scaly particles, metal oxides between the metal particles are easily retained and adhesiveness between the resistance heating elements and the ceramic substrate is made sure. Moreover, the resistance value can be made large. Thus, this case is profitable.

Examples of the resin used in the conductor containing paste include acrylate resins, epoxy resins, phenol resins and the like. Examples of the solvent are isopropyl alcohol and the like. Examples of the thickener are cellulose and the like.

When the conductor containing paste for the resistance heating elements is formed on the above-mentioned insulating layer, it is preferred to add a metal oxide besides the metal particles to the conductor containing paste and sinter the metal particles and the metal oxide. By sintering the metal oxide together with the metal particles in this way, the insulating layer can be closely adhered to the metal particles.

The reason why the adhesiveness to the insulating layer is improved by mixing the metal oxide is unclear, but would be based on the following. The surface of the metal particles is slightly oxidized so that an oxidized film is formed thereon. This oxidized film is integrated with the oxide in the insulating layer through the metal oxide so that the metal particles are closely adhered to the insulating layer.

A preferred example of the metal oxide is at least one selected from the group consisting of lead oxide, zinc oxide, silica, boron oxide ($B_2O_3$), alumina, yttria, and titania.

These oxides make it possible to improve adhesiveness between the metal particles and the insulating layer without increasing the resistance value of the resistance heating elements.

When the total amount of the metal oxides is set to 100 parts by weight, the weight ratio of lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The ratio is preferably adjusted within the scope that the total thereof is not over 100 parts by weight.

By adjusting the amounts of these oxides within these ranges, the adhesiveness to the insulating layer can be particularly improved.

The added amount of the metal oxides to the metal particles is preferably from 0.1% by weight or more and less than 10% by weight. The area resistivity when the conductor containing paste having such a structure is used to form the resistance heating elements is preferably from 1 to 45 mΩ/□.

If the area resistivity is over 45 mΩ/□, the calorific value for an applied voltage becomes too large so that, in the ceramic substrate wherein resistance heating elements are disposed on its surface, their calorific value is not easily controlled. If the add amount of the metal oxide is 10% or more by weight, the area resistivity exceeds 50 mΩ/□ so that calorific value becomes too large. Thus, temperature-control becomes difficult so that evenness of temperature distribution deteriorates.

In case that the resistance heating elements are formed on the surface of the ceramic substrate, a metal covering layer is preferably formed on the surface of the resistance heating elements. The metal covering layer prevents a change in the resistance value based on oxidization of the inner metal sintered body. The thickness of the formed metal covering layer is preferably from 0.1 to 10 μm.

The metal used when the metal covering layer is formed is not particularly limited if the metal is a metal which is non-oxidizable. Specific examples thereof include gold, silver, palladium, platinum, nickel and the like. These may be used alone or in combination of two or more. Among these metals, nickel is preferred.

In case that the resistance heating elements are formed inside the ceramic substrate, no coating is necessary since the surface of the resistance heating elements is not oxidized.

In the present invention, it is desired to make the bottomed holes 14 in the bottom face of the ceramic substrate, as illustrated in FIG. 1, insert and fix temperature-measuring elements into the bottomed holes 14, measure the temperature of the ceramic substrate, and control the temperature of the ceramic substrate on the basis of this measured temperature.

The used temperature-measuring elements are not particularly limited, and may be, for example, thermocouples. The size of the connecting portions between wires and the thermocouples is preferably the same as the strand diameter of the respective metal wires or more, and is 0.5 mm or less. Such a structure makes the heat capacity of the connecting portion small, and causes a temperature to be correctly and rapidly converted to a current value. For this reason, temperature controllability is improved so that temperature distribution in the heated face of the wafer becomes small.

Examples of the thermocouple include K, R, B, S, E, J and T type thermocouples, described in JIS-C-1602 (1980).

It is allowable to use brazing gold, brazing silver and the like to adhere the temperature-measuring elements to the bottoms of the bottomed holes 14, or to insert the temperature-measuring elements into the bottomed holes 14 and then seal the holes with a heat resistant resin and the like. The two methods may be combined with each other.

Examples of the heat resistant resin may be thermosetting resins, in particular epoxy resins, polyimide resins, and bismaleimide-triazine resins and the like. These resins may be used alone or in combination of two or more.

Examples of the brazing gold include an alloy made of 37 to 80.5% by weight of Au and 63 to 19.5% by weight of Cu, and an alloy made of 81.5 to 82.5% by weight of Au and 18.5 to 17.5% by weight of Ni and the like. These have a melting temperature of 900° C. or more and are not easily melted even at a high temperature range.

The brazing silver may be, for example, of an Ag—Cu type.

The above has described the ceramic heater of the first aspect of the present invention. In case that: the ceramic substrate itself has a relatively large volume resistivity; and a short circuit is not easily caused in the electrodes disposed inside, the resistance heating elements may be disposed on the surface of the ceramic substrate and further electrostatic electrodes may be disposed inside the ceramic substrate so as to make an electrostatic chuck.

The resistance heating elements and a chuck top conductor layer may be disposed on the surface of the ceramic substrate, and guard electrodes and ground electrodes may be disposed inside the ceramic substrate so as to make a wafer prober.

Figure 6:
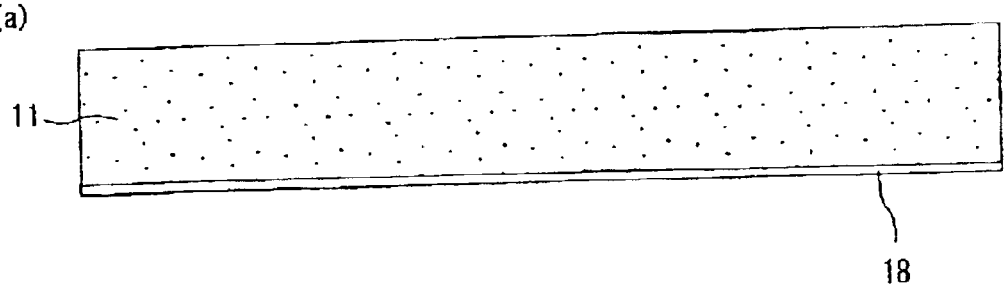
FIGS. 6(a) to (d) are sectional views that schematically illustrate parts of the process for producing a ceramic heater.
Figure 6:
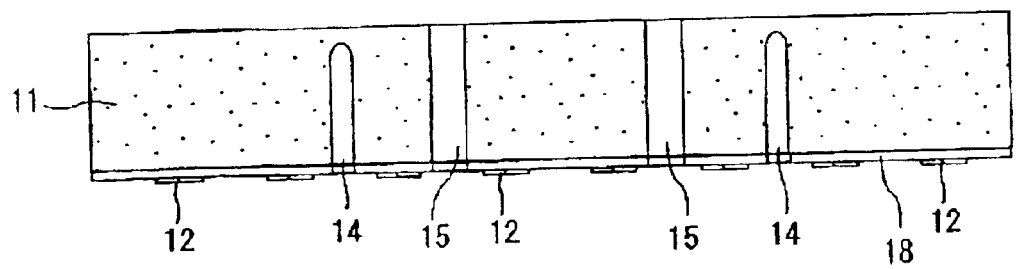
Figure 6:
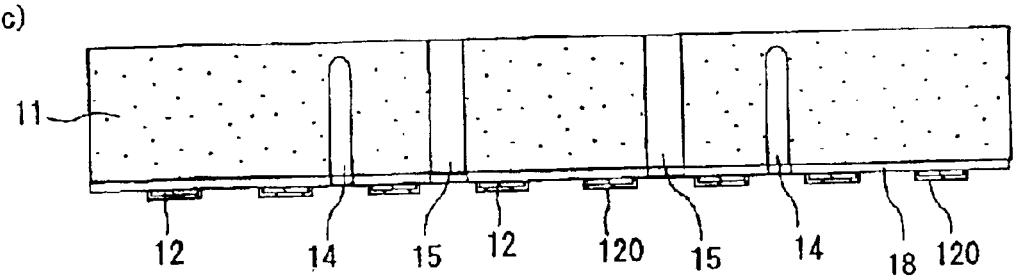
Figure 6:
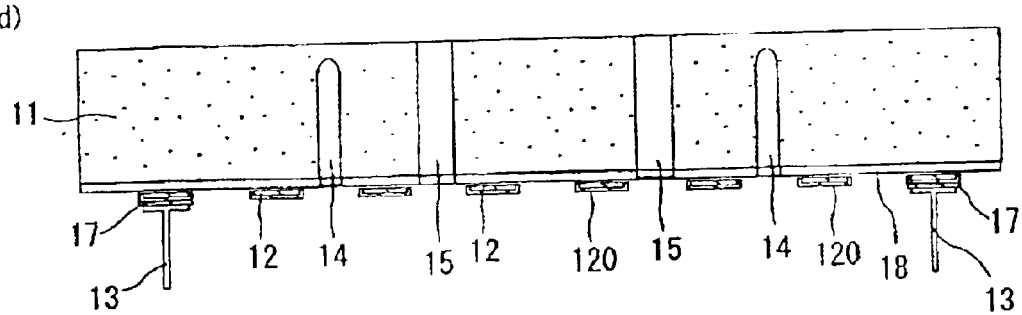
Figure 7:
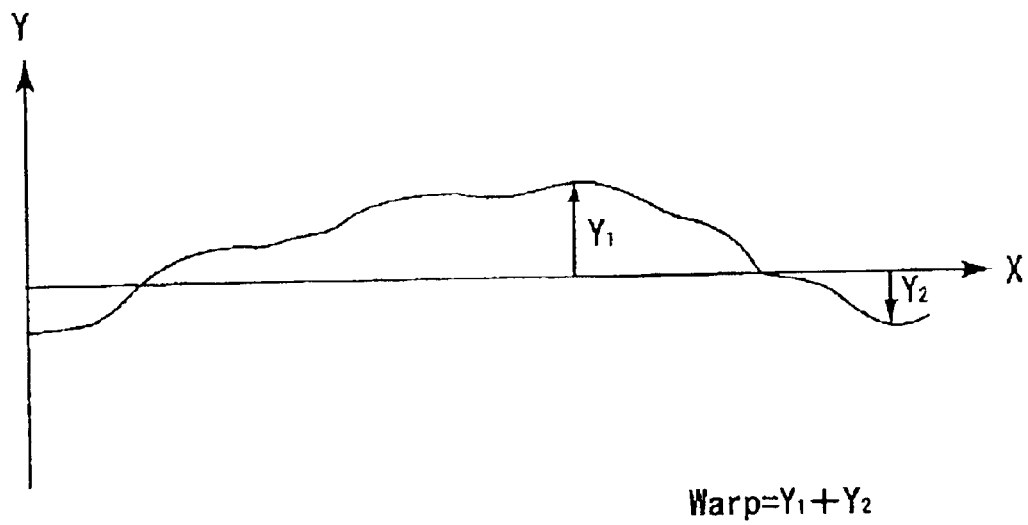
FIG. 7 is a graph showing a relationship between positions in the horizontal direction and the vertical direction of a ceramic substrate having warp and undulation.
Figure 8:
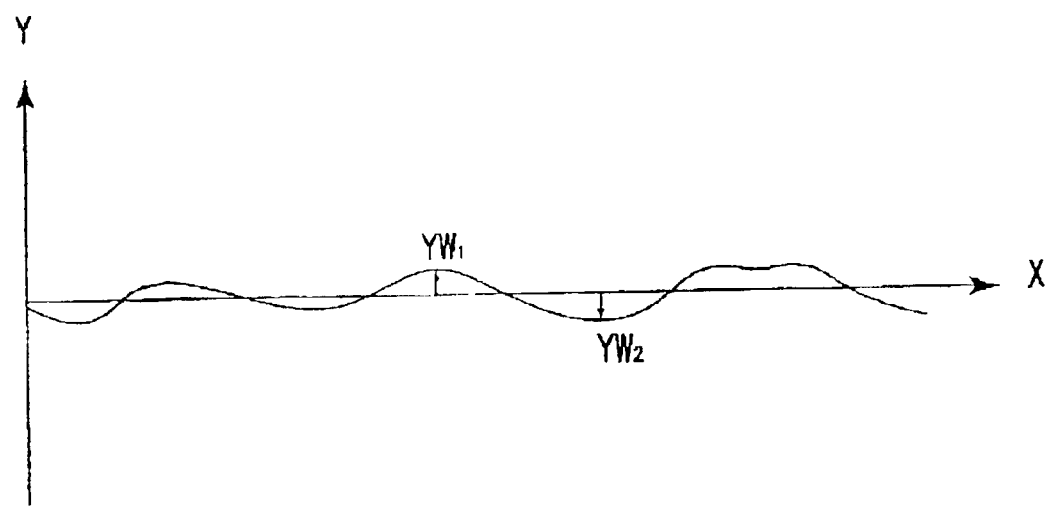
FIG. 8 is a graph in which the warp component in the graph shown in FIG. 7 is subtracted from the measured data.

On the basis of FIG. 6, the following will describe one example of a process for producing the ceramic substrate of the present invention.

FIGS. 6(a) to (d) are sectional views schematically illustrating a process for producing a ceramic heater having resistance heating elements on an insulating layer formed on the bottom face of a ceramic substrate.

(1) Step of Forming the Ceramic Substrate

A slurry is prepared by blending ceramic powder of, aluminum nitride, silicon carbide and the like with a sintering aid such as yttria or boron, a binder and so on based on necessity. Thereafter, this slurry is made into a granular form by spray-drying and the like. The granule is put into a mold and pressed to be formed into a plate form and the like form. Thus, a raw formed body(green) is formed. At the time of preparing the slurry, amorphous or crystalline carbon may be added.

Next, this raw formed body is heated and fired to be sintered. Thus, a plate comprising the ceramic is produced. Thereafter, the plate is made into a given shape to produce the ceramic substrate 11. The shape of the raw formed body may be such a shape that the sintered body can be used as it is. By heating and firing the raw formed body under pressure, the ceramic substrate 11 having no pores can be produced. It is sufficient chat the heating and the firing are performed at sintering temperature or higher. The firing temperature is from 1000 to 2500° C. for nitride ceramics or carbide ceramics.

Next, for example, a solution of alumina sol, silica sol and the like, which is prepared by hydrolyzing an alkoxide, is applied to a bottom face 11b of the ceramic substrate 11 by spin-coating method. The resultant product is dried and fired to form an insulating layer 18. The insulating layer 18 may be formed by a method of sputtering or CVD. The surface of the ceramic substrate may be oxidized by heating the ceramic substrate in an oxidizing atmosphere, so as to make the insulating layer 18 (FIG. 6(a)).

Next, through holes 15, into which lifter pins for supporting a silicon wafer will be inserted, and bottomed holes 14, into which temperature-measuring elements such as thermocouples will be embedded, are made in the ceramic substrate if necessary.

(2) Step of Printing a Conductor Containing Paste on the Insulating Layer Formed on the Ceramic Substrate A conductor containing paste is generally a fluid comprising metal particles, a resin and a solvent, and has a high viscosity. This conductor containing paste is printed in portions where resistance heating elements are to be arranged by screen printing and the like, to form a conductor containing paste layer. Since it is necessary that the resistance heating elements make the temperature of the whole of the ceramic substrate even, the conductor containing paste is preferably printed into, for example, the shape of concentric circles-like or a pattern of the shape of concentric circles-like combined with the shape of bending lines.

The conductor containing paste layer is preferably formed in the manner that a section of the resistance heating elements 12 after the firing is rectangular and flat.

(3) Firing of the Conductor Containing Paste

The conductor containing paste layer printed on the insulating layer on the bottom face of the ceramic substrate 11 is heated or fired to remove the resin and the solvent and sinter the metal particles. Thus, the metal particles are baked onto the bottom face of the ceramic substrate 11 to form the resistance heating elements 12 (FIG. 6(b)). The heating and firing temperature is preferably from 500 to 1000° C.

If the above-mentioned metal oxides are added to the conductor containing paste, the metal particles, the insulating layer and the metal oxides are sintered to be integrated with each other. Thus, the adhesiveness between the resistance heating elements and the insulating layer is improved.

(4) Step of Forming a Covering Layer

A covering layer 120 is desirably formed on the surface of the resistance heating elements 12.

The covering layer 120 can be formed by electroplating, electroless plating, sputtering and the like. From the viewpoint of mass-productivity, electroless plating is optimal (FIG. 6(c)).

(5) Fitting of Terminals and so on

External terminals 13 for connection to a power source are connected to ends of the circuits of the resistance heating elements 12 through a solder layer 17 comprising tin-lead solder (FIG. 6(d)). Brazing gold or brazing silver may be used to perform the connection. Thermocouples (not illustrated) are inserted into the bottomed holes 14. The bottomed holes are sealed with a heat resistant resin such as a polyimide, or a ceramic to finish the production of the ceramic heater 10.

In case that the ceramic substrate constituting the above-mentioned ceramic heater has a relatively large volume resistivity; and a short circuit is not easily caused in its electrodes and the like, an electrostatic chuck can be produced by disposing electrostatic electrodes inside the ceramic substrate when the ceramic heater is produced. A wafer prober can be produced by disposing a chuck top conductor layer on the heating face and disposing guard electrodes and ground electrodes inside the ceramic substrate at the same time as above.

In the above-mentioned process for producing the ceramic substrate, the granule containing the ceramic powder is used to produce the ceramic substrate. However, the ceramic substrate may be produced by using the ceramic powder, a binder, a solvent and so on to prepare green sheets and then laminating the green sheets. In case that electrode and so on are disposed inside, the electrodes and so on can be relatively easily formed by this process.

The following will describe the ceramic heater according to the second aspect of the present invention.

The ceramic heater according to the second aspect of the present invention is a ceramic heater comprising a ceramic substrate and a resistance heating element formed on a surface of the ceramic substrate, wherein the ceramic substrate is warped in one direction.

By letting the ceramic substrate warp in one direction in this way, in case that a semiconductor wafer is heated in the state that the semiconductor wafer is separated from the ceramic substrate by a given distance, the distance between the semiconductor wafer and the ceramic substrate can easily be grasped and the surface temperature of the semiconductor wafer can be made even.

The method for letting the ceramic substrate warp in one direction is not particularly limited. Examples thereof include a method of disposing, at a portion which is inside the ceramic substrate and has a given depth from its heating face, a layer (a metal layer, a ceramic layer and the like) whose thermal expansion coefficient is different from that of the ceramic substrate; a method of depositing an insulating layer on the bottom face, as performed in the ceramic heater of the first aspect of the present invention; and the like.

In the ceramic heater of the second aspect of the present invention, an insulating layer is deposited on the bottom face of the ceramic substrate and the resistance heating element is disposed on the insulating layer in the same way as in the first aspect of the present invention, alternatively, inside the ceramic substrate a layer made of a material which is different from that of the ceramic substrate is disposed. In case that inside the ceramic substrate the layer made of the material which is different from that of the ceramic substrate is disposed, other parts are made in the same way as in the ceramic heater of the first aspect of the present invention.

The method for depositing the insulating layer on the bottom face has been described in the first aspect of the present invention. Thus, the description is omitted. In case that the layer made of the different material is formed inside the ceramic substrate, it is advisable that a metal foil and the like is put therein when granule is put into a mold. In case that green sheets are laminated to make a formed body, it is advisable that a paste layer containing powder of such a material is formed on the green sheet.

Structures of other parts of the ceramic substrate are the same as those in the first aspect of the present invention. Thus, the description thereof is omitted herein.

In the second aspect of the present invention, an electrostatic chuck can also be formed by disposing electrostatic electrodes inside the ceramic substrate, and a wafer prober can be formed by disposing a chuck top conductor layer on the heating face and disposing guard electrodes and ground electrodes inside the ceramic substrate.

BEST MODE FOR CARRYING OUT THE INVENTION

The present invention will be described in more detail hereinafter.

EXAMPLE 1

Production of a Ceramic Heater Made of Silicon Carbide (1) The following were mixed: 100 parts by weight of silicon carbide powder (average particle diameter: 0.3 μm), 4 parts by weight of $B_4C$ (average particle diameter: 0.5 μm) as a sintering aid, 0.5 part by weight of C (Mitsubishi Diablack, made by Mitsubishi Chemical Corp.), 12 parts by weight of an acrylic binder, 0.5 part by weight of a dispersant and an alcohol. Thereafter, the mixture was subjected to spray-drying to make granular powder.

(2) Next, this granular powder was put into a mold and formed into a flat plate form to obtain a raw formed body (green).

(3) The raw formed body subjected to the above-mentioned processing treatment was hot-pressed at 2100° C. and a pressure of 17.6 (180 kg/cm²) MPa to obtain a silicon carbide ceramic substrate having a thickness of 3 mm. Next, this plate was cut out into a disk having a diameter of 210 mm to prepare a ceramic substrate 11.

(4) Next, a sol solution prepared by hydrolyzing a mixed solution of 25 parts by weight of tetraethylsilicate, 37.6 parts by weight of ethanol, 0.3 part by weight of hydrochloric acid, and 23.5 parts by weight of water under stirring and polymerizing the mixed solution was applied to the ceramic substrate 11 by spin-coating method. Next, the resultant product was dried at 80° C. for 5 hours, and was fired at 1000° C. for 1 hour, so as to form an insulating layer 18, which had a thickness of 2 μm and was comprising a SiO$_2$ film, on the bottom face of the ceramic substrate 11 comprising silicon carbide (FIG. 6(a)).

(5) The ceramic substrate 11 on which the insulating layer 18 was formed was drilled to make through holes 15, into which lifter pins of a silicon wafer, would be inserted, and bottomed holes 14, into which thermocouples would be embedded.

(6) After the working of the above-mentioned (5) was finished, a conductor containing paste was printed on the bottom face of the ceramic substrate 11 having the insulating layer 18 by screen printing. The pattern of the printing was made to a pattern of concentric circles-like as illustrated in FIG. 1.

The conductor containing paste was a silver-lead paste and contained 7.5 parts by a weight of metal oxides composed of lead oxide (5% by weight), zinc oxide (55% by weight), silica (10% by weight), boron oxide (25% by weight) and alumina (5% by weight) per 100 parts by weight of silver. The silver particles had an average particle diameter of 4.5 μm, and were scaly (7) Next, the ceramic substrate 11 on which the conductor containing paste was printed was heated and fired at 780° C. to sinter silver and lead in the conductor containing paste and bake them onto the sintered body. Thus, resistance heating elements 12 were formed (FIG. 6(b)). The silver-lead resistance heating elements 12 had a thickness of 5 μm, a width of 2.4 mm and an area resistivity of 7.7 mΩ/□.

(8) Next, the ceramic substrate 11 formed in the step (7) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride to precipitate a covering layer (nickel layer) 120 having a thickness of 1 μm on the surface of the silver-lead resistance heating elements (FIG. 6(c)).

(9) By screen printing, a silver-lead solder paste (made by Tanaka Kikinzoku Kogyo Co.) was printed on end portions of the resistance heating elements 12 (circuits) to attain connection to a power source. In this way, a solder paste layer was formed.

Next, external terminals 13 made of koval were put on the solder paste layer and heated and reflowed at 420° C. to connect the end portions of the resistance heating elements 12 to the external terminals 13 through the solder layer 17.

(8) Subsequently, thermocouples for controlling temperature were inserted into the bottomed holes 14 and a ceramic adhesive agent (Aron ceramic, made by Toagosei Co., Ltd.) was buried into the holes to fix the thermocouples. In this way, a ceramic heater 10 was obtained (FIG. 6(d)).

EXAMPLE 2

Production of a Ceramic Heater Made of Silicon Carbide

A ceramic heater made of silicon carbide was produced in the same manner as in Example 1 except that powder of silicon carbide having an average particle diameter of 1.0 μm was used, the sintering temperature was set to 1900° C., and further the surface of the resultant ceramic substrate was fired at 1500° C. for 2 hours to form an insulating layer having a thickness of 1 μm and comprising SiO$_2$.

EXAMPLE 3

Production of a Ceramic Heater Made of Aluminum Nitride (1) A composition made of 100 parts by weight of aluminum nitride powder (average particle diameter: 0.6 μm), 4 parts by weight of yttria (Y$_2$O$_3$, average particle diameter: 0.4 μm), 12 parts by weight of an acrylic resin binder, and an alcohol was subjected to spray-drying, so as to make granular powder.

(2) Next, this granular powder was put into a mold and formed into a flat plate form to obtain a raw formed body (green).

(3) The raw formed body subjected to the above-mentioned processing treatment was hot-pressed at 1800° C. and a pressure of 200 kg/cm$^2$ to obtain an aluminum nitride sintered body having a thickness of 3 mm.

Next, this plate was cut out into a disk having a diameter of 210 mm to prepare a ceramic substrate 11. In the same way as in Example 1, the sol solution used in Example 1 was applied onto the bottom face of this ceramic substrate, and the resultant product was dried and fired, so as to form an insulating layer, which had a thickness of 2 μm and comprising a SiO$_2$ film, on the bottom face of the ceramic substrate.

Next, this ceramic substrate 11 was drilled to make through holes, into which lifter pins would be inserted, and bottomed holes (diameter: 1.1 mm, depth: 2 mm), into which thermocouples would be embedded.

(4) A conductor containing paste was printed on the bottom face of the ceramic substrate 11 obtained in the above-mentioned (3) by screen printing. The pattern of the printing was made to a pattern of concentric circles-like as illustrated in FIG. 1. The used conductor containing paste was Solvest PS603D made by Tokuriki Kagaku Kenkyu-zyo, which is used to form plated through holes in print circuit boards.

The conductor containing paste was a silver-lead paste and contained 7.5 parts by weight of metal oxides composed of lead oxide (5% by weight), zinc oxide (55% by weight), silica (10% by weight), boron oxide (25% by weight) and alumina (5% by weight) per 100 parts by weight of silver. The silver particles had an average particle diameter of 4.5 μm, and were scaly.

(5) Next, the ceramic substrate 11 on which the conductor containing paste was printed was heated and fired at 780° C. to sinter silver and lead in the conductor containing paste and bake them onto the sintered body. Thus, resistance heating elements 12 were formed. The silver-lead resistance heating elements 12 had a thickness of 5 μm, a width of 2.4 mm and an area resistivity of 7.7 mΩ/□.

(6) Next, the sintered body formed in the above-mentioned (5) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride to precipitate a covering layer (nickel layer) 120 having a thickness of 1 μm on the surface of the silver-lead resistance heating elements.

(7) By screen printing, a silver-lead solder paste (made by Tanaka Kikinzoku Kogyo Co.) was printed on end portions of the resistance heating elements 12 (circuits) to attain connection to a power source. In this way, a solder paste layer was formed.

Next, external terminals 13 made of koval were put on the solder paste layer and heated and reflowed at 420° C. to connect the end portions of the resistance heating elements 12 to the external terminals 13 through the solder layer 17.

(8) Thermocouples for controlling temperature were inserted into the bottomed holes 14 and a ceramic adhesive agent (Aron ceramic, made by Toagosei Co., Ltd.) was buried into the holes to fix the thermocouples. In this way, a ceramic heater was obtained.

EXAMPLE 4

Figure 9:
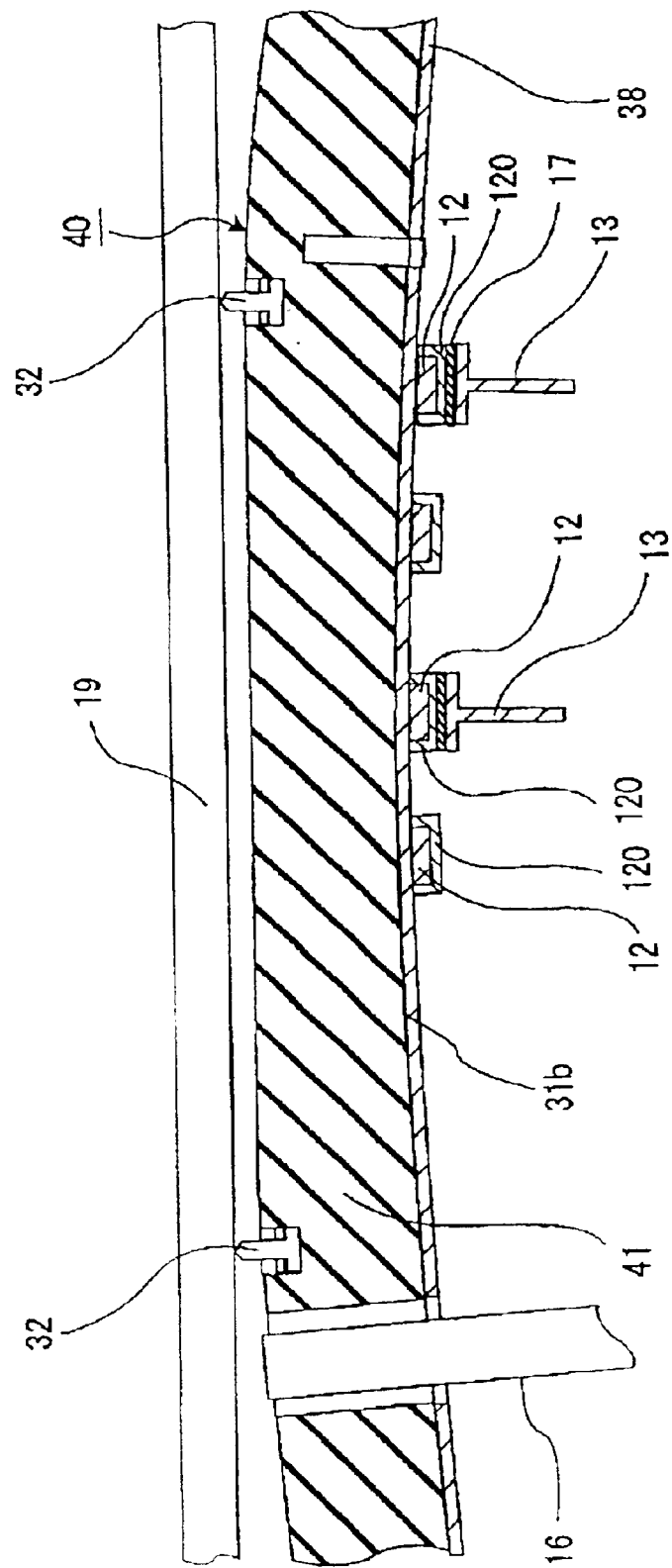
FIG. 9 is a sectional view that schematically illustrates a still further example of the ceramic heater of the present invention.

A ceramic heater was produced in the same way as in Example 1 except that the central portion of the heating face of the ceramic substrate was ground to make the face flat (reference to FIG. 9).

COMPARATIVE EXAMPLE 1

A ceramic heater was produced in the same way as in Example 1 except that no insulating layer comprising $SiO_2$ was disposed on the bottom face.

About the ceramic heaters according to Examples 1 to 4 and Comparative Example 1 produced as described above, the distance from the plane to the center and the outer circumference of the ceramic substrate (surface flatness) was measured. A shape-measuring device (made by Keyence Corporation) was used for the measurement of the flatness.

About the ceramic heaters according to Examples 1, 2 and 4 and Comparative Example 1, the temperature thereof was raised to 150° C., and about the ceramic heater according to Example 3, the temperature was raised to 400° C. The resistance values of their independent circuits were then measured to determine whether or not a short circuit was caused in the circuit.

Furthermore, about the ceramic heaters according to Examples 1 to 4 and Comparative Example 1, the temperature of the central portion of their ceramic substrate was raised to about 400° C. Temperature difference between the periphery and the central portion was measured on the ceramic substrate and the silicone wafer with a thermoviewer (IR-16-2012-0012, made by Japan Datum Company).

A tape test, wherein the test specimen was heated to 400° C. and cooled and then a tape was adhered to its heating element and stripped off, was carried out. The results are shown in Table 1.

TABLE 1

| | Short circuit | Temperature difference in the ceramic substrate (° C.) | Temperature difference in the silicon wafer (° C.) | Warp amount (µm) | Tape test (exfoliation) |
|---|---|---|---|---|---|
| Example 1 | None | 10 | 2 | 40 | None |
| Example 2 | None | 10 | 3 | 25 | None |
| Example 3 | None | 10 | 3 | 40 | None |
| Example 4 | None | 10 | 3 | 20 | None |
| Comparative Example 1 | Caused | 6 | 10 | 15 | Caused |

Note)
temperature difference = temperature of the periphery − temperature of the central portion As shown in Table 1, in the ceramic heaters according to Examples 1 to 4, the temperature of the periphery of their ceramic substrate was made high to make the temperature difference between the temperature of the periphery and the temperature of the central portion large. This is because the relationship between the ceramic substrate and the silicon wafer is like a relationship shown in FIG. 5 or 9. That is, in the ceramic substrate 30 illustrated in FIG. 5, the distance between the ceramic substrate 30 and the silicon wafer 19 becomes larger at a position being nearer to the peripheral portion than the center portion. In the ceramic substrate 40 as illustrated in FIG. 9, its central portion is made flat; therefore, the distance between the silicon wafer 19 and the ceramic substrate 40 is substantially the same at its central portion, however, in the peripheral part thereof, the distance between the silicon wafer 19 and the ceramic substrate 40 becomes larger as a position is nearer to the outer circumference. In the ceramic substrate according to the above-mentioned Examples, the temperatures of the peripheral portions of the ceramic substrates 30 and 40 are made high as described above. Therefore, the temperature of the silicon wafer 19 can be made even.

On the other hand, in the ceramic heater according to Comparative Example 1, the temperature difference in the ceramic substrate was made as small as 6° C., but the temperature difference in the silicon wafer was large. It can be presumed that this resulted from undulation of the ceramic substrate.

In Comparative Example 1, an exfoliation of the resistance heating elements was caused in the tape test. This can be considered as follows: resistance heating element was not formed on the insulating layer; therefore, adhesive strength between the ceramic substrate and the resistance heating elements was weak so that the exfoliation was caused. On the other hand, in the case of Examples, the resistance heating elements adhered closely to the insulating layer; therefore, no exfoliation was caused.

INDUSTRIAL APPLICABILITY

As described above, in the ceramic heater of the first aspect of the present invention, an insulating layer is formed on a surface of its ceramic substrate, and on the insulating layer a resistance heating element is formed. Therefore, a short circuit in the resistance heating element can be prevented, and it is caused to function as a ceramic heater.

In the second aspect of the present invention, a ceramic substrate is warped in one direction. Therefore, in case that a semiconductor wafer is heated in the state that the semiconductor wafer is separated from the ceramic substrate by a given distance, the distance between the semiconductor wafer and the ceramic substrate can easily be grasped. By performing temperature-control on the basis of this, the surface temperature of the semiconductor wafer can be made even.

What is claimed is:

1. A ceramic heater comprising:
    a ceramic substrate comprising a heating face configured to heat a wafer;
    an insulating layer having a thickness of between 0.1 and 1000 µm and a volume resistivity higher than that of said ceramic substrate, and disposed on a surface of said ceramic substrate; and
    a resistance heating element disposed on an opposite side of the heating face and disposed on said insulating layer.

2. The ceramic heater according to claim 1, wherein said ceramic substrate comprises a carbide ceramic or a nitride ceramic and said insulating layer comprises an oxide ceramic.

3. The ceramic heater according to claim 1, wherein the volume resistivity of said insulating layer is at least 10 times the volume resistivity of said ceramic substrate.

4. The ceramic heater according to claim 1, wherein the insulating layer has a thickness between 1 and 1000 µm.

5. The ceramic heater according to claim 1, wherein a supporting pin is disposed in the heating face.

6. The ceramic heater according to claim 5,
wherein the supporting pin comprises a tip having a spired form or a semicircular form.

7. The ceramic heater according to claim 1, further comprising:
means for holding a silicon wafer between 50 and 2000 μm from the heating face and for heating the silicon wafer.

8. The ceramic heater according to claim 1,
wherein the ceramic substrate comprises a carbide ceramic or a nitride ceramic.

9. A ceramic heater comprising;
a ceramic substrate comprising a heating face, the ceramic substrate warned in one direction;
a supporting pin disposed in the heating face; and
a resistance heating element disposed on a surface of said ceramic substrate; and disposed on an opposite side of the heating face.

10. The ceramic heater according to claim 9,
wherein the ceramic substrate is warped between 20 and 100 μm.

11. The ceramic heater according to claims 9,
wherein the ceramic substrate is warped greater than 25 μm and less than or equal to 100 μm.

12. The ceramic heater according to claim 9, further comprising:
means for holding a silicon wafer between 50 and 2000 μm from the heating face and for heating the silicon wafer.

* * * * *